US010833387B2

(12) United States Patent
Chen et al.

(10) Patent No.: US 10,833,387 B2
(45) Date of Patent: Nov. 10, 2020

(54) MAGNETIC RESONANCE IMAGING DEVICE, POWER AMPLIFIER MODULE AND POWER COMBINER

(71) Applicant: GE Precision Healthcare LLC, Wauwatosa, WI (US)

(72) Inventors: Jifeng Chen, Gangzhou (CN); Tingting Song, ShangHai (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 271 days.

(21) Appl. No.: 15/567,011

(22) PCT Filed: Apr. 5, 2016

(86) PCT No.: PCT/CN2016/078474
§ 371 (c)(1),
(2) Date: Oct. 16, 2017

(87) PCT Pub. No.: WO2016/165571
PCT Pub. Date: Oct. 20, 2016

(65) Prior Publication Data
US 2018/0102580 A1  Apr. 12, 2018

(30) Foreign Application Priority Data

Apr. 16, 2015 (CN) .......................... 2015 1 0181778

(51) Int. Cl.
*H01P 5/16* (2006.01)
*G01R 33/36* (2006.01)
(52) U.S. Cl.
CPC ............ *H01P 5/16* (2013.01); *G01R 33/3614* (2013.01)
(58) Field of Classification Search
CPC ........ H03F 3/698; H01P 5/16; G01R 33/3614
See application file for complete search history.

(56) References Cited

U.S. PATENT DOCUMENTS 5,872,491 A * 2/1999 Kim .......................... H01P 1/10
  333/101
6,026,286 A * 2/2000 Long .................... H03D 7/1433
  455/319

(Continued)

FOREIGN PATENT DOCUMENTS

| CN | 201018578 Y | 6/2008 |
| CN | 102013542 A | 4/2011 |
| CN | 104022333 A | 9/2014 |

OTHER PUBLICATIONS

English translation of International Search Report and Written Opinion for International Application No. PCT/CN2016/078474 dated Jun. 12, 2016. 13 pages.

*Primary Examiner* — Jermele M Hollington
*Assistant Examiner* — Suresh K Rajaputra
(74) *Attorney, Agent, or Firm* — Armstrong Teasdale LLP

(57) ABSTRACT

A power combiner comprises a first transmission line or lumped circuit element, a second transmission line or lumped circuit element, a third transmission line or lumped circuit element, a fourth transmission line or lumped circuit element and a balance capacitive element (Cbal) or balance inductive element (Lbal). The first transmission line or lumped circuit element is coupled to a first port. The second transmission line or lumped circuit element is coupled between the first transmission line or lumped circuit element and a common port. The third transmission line or lumped circuit element is coupled to a second port. The fourth transmission line or lumped circuit element is coupled between the third transmission line or lumped circuit element and the common port. The balance capacitive element (Cbal) or the balance inductive element (Lbal) is coupled between a connection point between the first transmission line or lumped circuit element and the second transmission line or lumped circuit element and a connection point (Continued)

between the third transmission line or lumped circuit element and the fourth transmission line or lumped circuit element. Further provided are a power amplifier module and a magnetic resonance imaging device.

13 Claims, 10 Drawing Sheets

(56) References Cited

U.S. PATENT DOCUMENTS

| | | |
|---|---|---|
| 6,570,466 B1 | 5/2003 | Bahl |
| 2014/0132364 A1 | 5/2014 | Ehyaie |
| 2015/0002242 A1 | 1/2015 | Goritz |

* cited by examiner

MAGNETIC RESONANCE IMAGING DEVICE, POWER AMPLIFIER MODULE AND POWER COMBINER

CROSS-REFERENCE TO RELATED APPLICATIONS

This is a national stage application under 35 U.S.C. § 371 (c) of PCT Patent Application No. PCT/CN2016/078474, filed on Apr. 5, 2015, which claims priority to Chinese Patent Application No. 201510181778.1, filed on Apr. 16, 2015, the disclosures of which are incorporated herein by reference in their entireties.

BACKGROUND

The present invention relates to a power combiner, a power amplifier module and a magnetic resonance imaging device.

As shown in FIG. 1, it is a circuit diagram of a Wilkinson power combiner 900 in the prior art/known technique. The Wilkinson power combiner 900 comprises a first port 902, a second port 904, a common port 906, a balance resistive element $Z_r$, a first transmission line 910 and a second transmission line 912. The first transmission line 910 is coupled between the first port 902 and the common port 906, and the second transmission line 912 is coupled between the second port 904 and the common port 906. One end of the balance resistive element $Z_r$ is coupled to a connection point between the first port 902 and the first transmission line 910, and the other end thereof is coupled to a connection point between the second port 904 and the second transmission line 912. The first port 902 is used for receiving a first electric power, the second port 904 is used for receiving a second electric power, and the Wilkinson power combiner 900 is used for combining the first electric power and the second electric power so as to generate a combined electric power, wherein the combined electric power is output from the common port 906 to a load $Z_L$.

When the first electric power and the second electric power are unbalanced, a difference power between the first electric power and the second electric power is consumed by the balance resistive element $Z_r$. However, the existence of the balance resistive element $Z_r$ may cause the following problems: first, when a current flows through the balance resistive element $Z_r$, the balance resistive element $Z_r$ will additionally consume electric energy, causing a low efficiency of the Wilkinson power combiner 900; and second, the damage to the balance resistive element $Z_r$ is one of the main causes of abnormal working of the Wilkinson power combiner 900 (especially in high-power applications, the possibility that a balance resistive element is damaged is greatly improved), that is, reducing the reliability of the Wilkinson power combiner 900.

SUMMARY

One or more aspects of the implementations of the present invention are now generalized so as to facilitate the basic understanding of the implementations of the present invention, wherein the generalization is not an extensible overview of the implementations of the present invention, and is neither intended to identify certain elements of the implementations of the present invention nor intended to define the range thereof. Rather, the main purpose of the generalization is to present some concepts of the implementations of the present invention in a simplified form before presenting descriptions in more detail below.

One aspect of the implementations of the present invention is to provide a power combiner, which comprises a first transmission line or lumped circuit element, a second transmission line or lumped circuit element, a third transmission line or lumped circuit element, a fourth transmission line or lumped circuit element and a balance capacitive element or a balance inductive element. The first transmission line or lumped circuit element is coupled to a first port. The second transmission line or lumped circuit element is coupled between the first transmission line or lumped circuit element and a common port. The third transmission line or lumped circuit element is coupled to a second port. The fourth transmission line or lumped circuit element is coupled between the third transmission line or lumped circuit element and the common port. The balance capacitive element or the balance inductive element is coupled between a connection point between the first transmission line or lumped circuit element and the second transmission line or lumped circuit element and a connection point between the third transmission line or lumped circuit element and the fourth transmission line or lumped circuit element.

Another aspect of the implementations of the present invention is to provide a power amplifier module, which comprises a first power amplifier for providing a first electric power, a second power amplifier for providing a second electric power and a power combiner. The power combiner comprises a first transmission line or lumped circuit element, a second transmission line or lumped circuit element, a third transmission line or lumped circuit element, a fourth transmission line or lumped circuit element and a balance capacitive element or a balance inductive element. The first transmission line or lumped circuit element is coupled to a first port for receiving the first electric power. The second transmission line or lumped circuit element is coupled between the first transmission line or lumped circuit element and a common port. The third transmission line or lumped circuit element is coupled to a second port for receiving the second electric power. The fourth transmission line or lumped circuit element is coupled between the third transmission line or lumped circuit element and the common port. The balance capacitive element or the balance inductive element is coupled between a connection point between the first transmission line or lumped circuit element and the second transmission line or lumped circuit element and a connection point between the third transmission line or lumped circuit element and the fourth transmission line or lumped circuit element.

Another aspect of the implementations of the present invention is to provide a magnetic resonance imaging system, which comprises a main magnet for generating a main magnetic field, a gradient coil assembly, a gradient amplifier, a radio frequency coil assembly and a radio frequency amplifier. The gradient amplifier is used for exciting the gradient coil assembly to produce a gradient magnetic field applied to the main magnetic field in a selected gradient axis. The radio frequency amplifier comprises a first power amplifier for providing a first electric power, a second power amplifier for providing a second electric power and a power combiner. The power combiner comprises a first transmission line or lumped circuit element, a second transmission line or lumped circuit element, a third transmission line or lumped circuit element, a fourth transmission line or lumped circuit element and a balance capacitive element or a balance inductive element. The first transmission line or lumped circuit element is coupled to a first port for receiving the first electric power. The second transmission line or lumped circuit element is coupled between the first transmission line or lumped circuit element and a common port. The third transmission line or lumped circuit element is coupled to a second port for receiving the second electric power. The fourth transmission line or lumped circuit element is coupled between the third transmission line or lumped circuit element and the common port. The balance capacitive element or the balance inductive element is coupled between a connection point between the first transmission line or lumped circuit element and the second transmission line or lumped circuit element and a connection point between the third transmission line or lumped circuit element and the fourth transmission line or lumped circuit element. The common port is used for providing a combined electric power based on combining the first electric power and the second electric power, wherein the combined electric power is used for exciting the radio frequency coil assembly to transmit a radio frequency signal.

Since the power combiner provided in the implementations of the present invention does not comprise a balance resistive element, the consumption of electric energy of the power combiner is approximately zero, that is to say, the efficiency of the power combiner is improved. Secondly, without the problem of abnormal working caused by the damage to the balance resistive element in the prior art, the reliability of the power combiner provided in the implementations of the present invention is improved.

BRIEF DESCRIPTION OF THE DRAWINGS

The implementations of the present invention can be better understood from the description of the implementations of the present invention in conjunction with the accompanying drawings, in which.

DETAILED DESCRIPTION

Hereafter, a detailed description will be given for embodiments of the present disclosure. It should be pointed out that in the detailed description of the embodiments, for simplicity and conciseness, it is impossible for the description to describe all the features of the practical embodiments in detail. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the claims and the description should have the same meanings as commonly understood by one of ordinary skill in the art to which the present disclosure belongs. The terms "first," "second," and the like in the description and the claims of the present application do not mean any sequential order, number or importance, but are only used for distinguishing different components. The terms "a", "an" and the like do not denote a limitation of quantity, but denote the existence of at least one. The terms "comprises," "comprising, "includes," "including," and the like mean that the element or object in front of the "comprises," "comprising," "includes," and "including" covers the elements or objects and their equivalents illustrated following the "comprises," "comprising," "includes," and "including," without excluding other elements or objects. The terms "coupled" or "connected" or the like is not limited to being connected physically or mechanically, nor limited to being connected directly or indirectly.

The implementations of the present invention relate to a power combiner, the power combiner comprising a first port, a second port and a common port. The first port is used for receiving a first electric power, the second port is used for receiving a second electric power, and the power combiner is used for combining the first electric power and the second electric power so as to generate a combined electric power. The combined electric power is output from the common port. One of the theories thereabout is that when a current flowing through the first port and a current flowing through the second port are unbalanced, a voltage at the first port is equal to a voltage at the second port.

Figure 1:
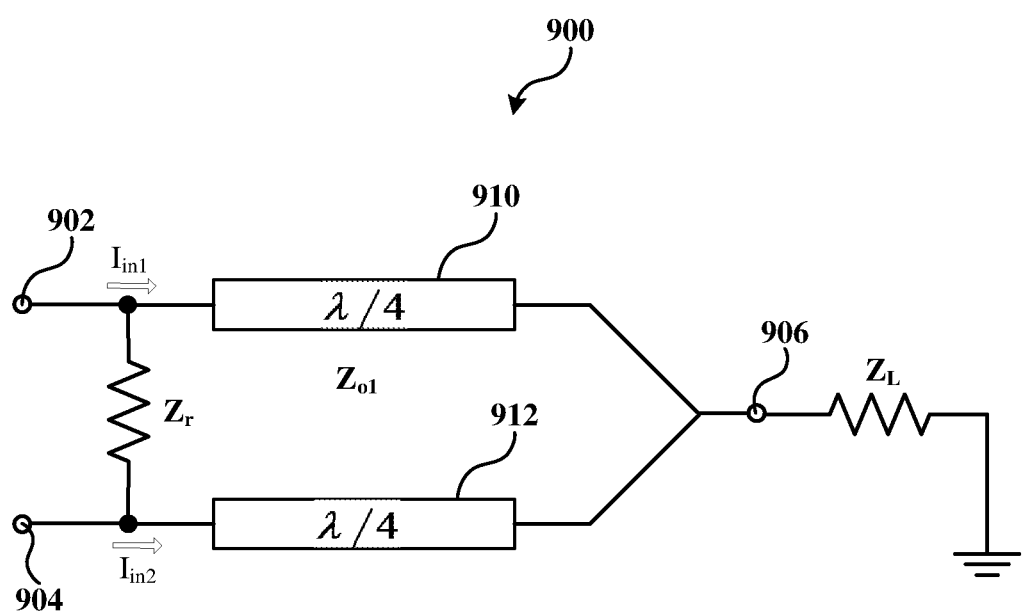
FIG. 1 is a circuit diagram of a Wilkinson power combiner in the prior art.

In order to explain the above-mentioned theory, a Wilkinson power combiner 900 as shown in FIG. 1 as a prior art technique is introduced in the implementation of the present invention.

In FIG. 1, an impedance value of a balance resistive element $Z_r$ is $2Z_0$, a characteristic impedance of a first transmission line 910 and a characteristic impedance of a second transmission line 912 are both $Z_{o1}$, an impedance value of $Z_{o1}$ is $\sqrt{2} Z_0$, and an impedance value of a load $Z_L$ is $Z_0$; in addition, an electrical length of the first transmission line 910 is equal to ¼ of a wavelength of a signal flowing through the first transmission line 910. Because of symmetry, an electrical length of the second transmission line 912 is equal to the electrical length of the first transmission line 910.

Figure 2:
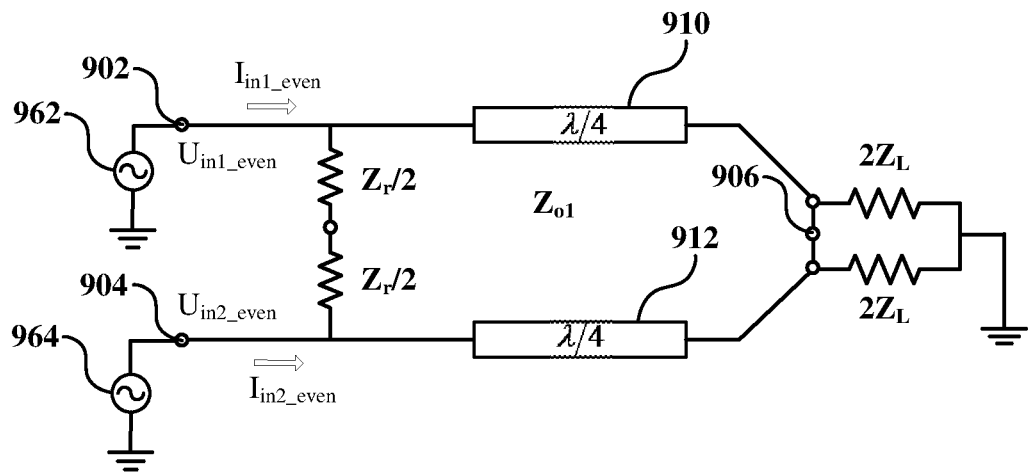
FIG. 2 is an even-mode excitation circuit of the Wilkinson power combiner shown in FIG. 1.
Figure 3:
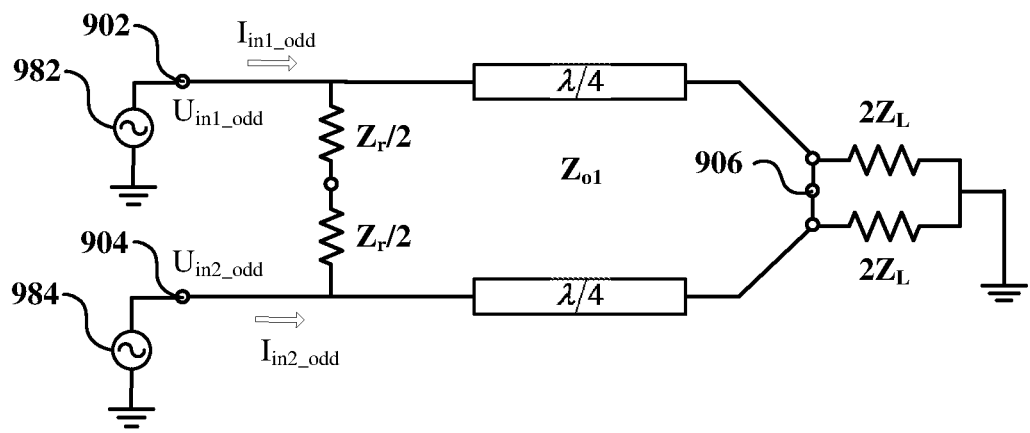
FIG. 3 is an odd-mode excitation circuit of the Wilkinson power combiner shown in FIG. 1.

The Wilkinson power combiner 900 shown in FIG. 1 can be decomposed into an even-mode excitation circuit shown in FIG. 2 and an odd-mode excitation circuit shown in FIG. 3.

In the even-mode circuit shown in FIG. 2, an even-mode excitation source 962 is coupled to a first port 902, and an even-mode excitation source 964 is coupled to a second port 904, so that an even-mode input current of the first port 902 is $I_{in1\_even}$, and an even-mode input current of the second port 904 is $I_{in2\_even}$.

In the odd-mode circuit shown in FIG. 3, an odd-mode excitation source 982 is coupled to the first port 902, and an odd-mode excitation source 984 is coupled to the second port 904, so that an odd-mode input current of the first port 902 is $I_{in1\_odd}$, and an odd-mode input current of the second port 904 is $I_{in2\_odd}$.

Since the first port 902 and the second port 904 are symmetrical, the relationship between the even-mode currents $I_{in1\_even}$ and $I_{in2\_even}$ even in FIG. 2 and a real input current $I_{in1}$ of the first port 902 and a real input current $I_{in2}$ of the second port 904 in FIG. 1 can be represented by using the following equation (1).

$$I_{in2\_even} = I_{in1\_even} = I_{in\_even} = \frac{I_{in1} + I_{in2}}{2} \quad (1)$$

The relationship between the odd-mode currents $I_{in1\_odd}$ and $I_{in2\_odd}$ in FIG. 2 and the real input current $I_{in1}$ of the first port 902 and the real input current $I_{in2}$ of the second port 904 in FIG. 1 can be represented by using the following equation (2).

$$I_{in2\_odd} = -I_{in1\_odd} = I_{in\_odd} = \frac{I_{in1} - I_{in2}}{2} \quad (2)$$

According to equations (1) and (2) mentioned above, the real input current $I_{in1}$ of the first port 902 and the real input current $I_{in2}$ of the second port 904 can be represented by using the following equations (3) and (4).

$$I_{in1} = I_{in\_even} + I_{in\_odd} \quad (3)$$

$$I_{in2} = I_{in\_even} - I_{in\_odd} \quad (4)$$

Likewise, a real input voltage $U_{in1}$ of the first port 902 and a real input voltage $U_{in2}$ of the second port 904 can be represented by using the following equations (5) and (6).

$$U_{in1} = U_{in1\_even} + U_{in1\_odd} = I_{in\_even} * Z_{in1\_even} + I_{in\_odd} * Z_{in1\_odd} \quad (5)$$

$$U_{in2} = U_{in2\_even} + U_{in2\_odd} = I_{in\_even} * Z_{in2\_even} - I_{in\_odd} * Z_{in2\_odd} \quad (6)$$

where $U_{in1\_even}$ and $U_{in1\_odd}$ are respectively an even-mode input voltage and an odd-mode input voltage of the first port 902, and $U_{in2\_even}$ and $U_{in2\_odd}$ are respectively an even-mode input voltage and an odd-mode input voltage of the second port 904; and $Z_{in1\_even}$ and $Z_{in1\_odd}$ are respectively an even-mode input impedance and an odd-mode input impedance of the first port 902, and $Z_{in2\_even}$ and $Z_{in2\_odd}$ are respectively an even-mode input impedance and an odd-mode input impedance of the second port 904.

From equations (3), (4), (5) and (6) mentioned above, a real input impedance $Z_{in1}$ of the first port 902 and a real input impedance $Z_{in2}$ of the second port 904 can be represented by using the following equations (7) and (8).

$$Z_{in1} = \frac{U_{in1}}{I_{in1}} = \frac{I_{in\_odd} * Z_{in1\_odd} + I_{in\_even} * Z_{in1\_even}}{I_{in\_odd} + I_{in\_even}} \quad (7)$$

$$Z_{in2} = \frac{U_{in2}}{I_{in2}} = \frac{I_{in\_odd} * Z_{in2\_odd} - I_{in\_even} * Z_{in2\_even}}{I_{in\_odd} - I_{in\_even}} \quad (8)$$

Figure 4:
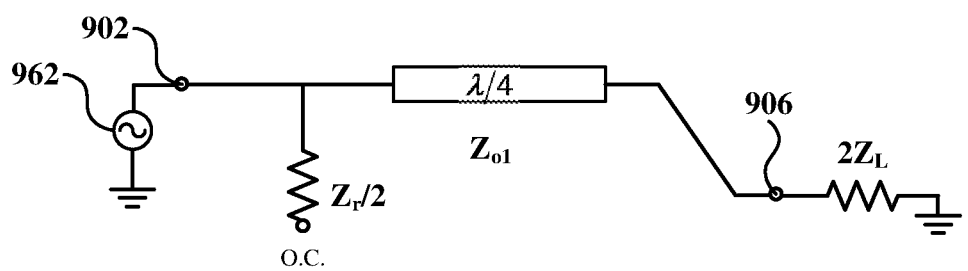
FIG. 4 is an exploded view of the even-mode excitation circuit shown in FIG. 2.

For even-mode excitation in FIG. 2, since the even-mode input current $I_{in1\_even}$ of the first port 902 is equal to the even-mode input current $I_{in2\_even}$ of the second port 904, that is, $I_{in1\_even} = I_{in2\_even}$, there is no current flowing though a resistor Zr, and therefore, the resistor Zr can be regarded to be open circuited. Therefore, the even-mode excitation circuit shown in FIG. 2 can be decomposed into circuits shown in FIG. 4. In FIG. 4, a resistor Zr/2 is redundant.

From FIG. 4, the even-mode input impedance $Z_{in1\_even}$ of the first port 902 can be represented by the following equation (9).

$$Z_{in1\_even} = \sqrt{2} Z_o \frac{(2Z_0) + j\sqrt{2} Z_o \tan \lambda/4}{\sqrt{2} Z_o + j(2Z_0) \tan \lambda/4} = \frac{(\sqrt{2} Z_o)^2}{2Z_0} = Z_0 \quad (9)$$

Since the circuits are symmetrical, equation (10) is represented as follows.

$$Z_{in2\_even} = Z_{in1\_even} = Z_{in\_even} = Z_0 \quad (10)$$

Figure 5:
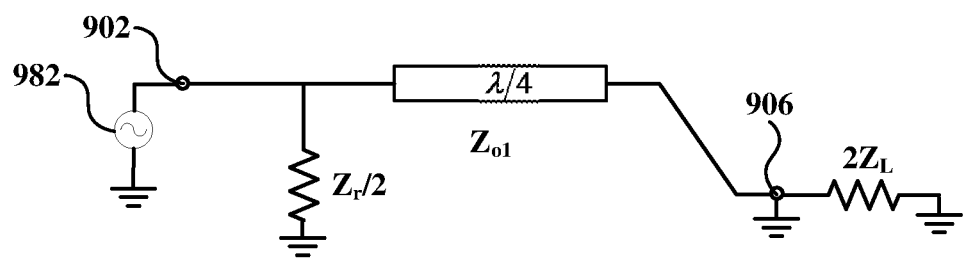
FIG. 5 is an exploded view of the odd-mode excitation circuit shown in FIG. 3.

For odd-mode excitation in FIG. 3, since $I_{in1\_odd} = -I_{in2\_odd}$, the odd-mode excitation circuit shown in FIG. 3 can be decomposed into circuits shown in FIG. 5. In FIG. 5, one end of the resistor Zr/2 is coupled between the first port 902 and the first transmission line 910, and the other end thereof is grounded, and the third port 906 is also grounded at the same time.

It can be derived from FIG. 5 that $$Z_{in1\_odd} = \frac{Z_r}{2} = Z_0.$$

Since the circuits are symmetrical, equation (11) is represented as follows.

$$Z_{in2\_odd} = Z_{in1\_odd} = Z_{in\_odd} = Z_0 \quad (11)$$

By substituting equations 10 and 11 into equations 7 and 8, the real input impedance $Z_{in1}$ of the first port 902 and the real input impedance $Z_{in2}$ of the second port 904 can be obtained, which are shown in equations (12) and (13).

$$Z_{in1} = \frac{U_{in1}}{I_{in1}} = \frac{I_{in\_odd} * Z_{in\_odd} + I_{in\_even} * Z_{in\_even}}{I_{in\_odd} + I_{in\_even}} = Z_0 \quad (12)$$

-continued $$Z_{in2} = \frac{U_{in2}}{I_{in2}} = \frac{I_{in\_odd} * Z_{in2\_odd} - I_{in\_even} * Z_{in2\_even}}{I_{in\_odd} - I_{in\_even}} = Z_0 \quad (13)$$

It can be seen from the above-mentioned analysis that since an odd-mode input impedance $Z_{in\_odd}$ is equal to an even-mode input impedance $Z_{in\_even}$, the real input impedance $Z_{in1}$ of the first port 902 is still equal to the impedance of the load $Z_L$ and the real input impedance $Z_{in2}$ of the second port 904 is still equal to the impedance of the load $Z_L$ when the real input current $I_{in1}$ of the first port 902 and the real input current $I_{in2}$ of the second port 904 are unbalanced. Therefore, the Wilkinson power combiner 900 can steadily work.

As stated previously, in the Wilkinson power combiner 900 shown in FIG. 1, when the real input current $I_{in1}$ of the first port 902 and the real input current $I_{in2}$ of the second port 904 are unbalanced, a difference power between an input power received by the first port 902 and an input power received by the second port 904 will be consumed by the resistor Zr, which will cause the resistor Zr to be damaged due to overheating and thus cause a damage to the Wilkinson power combiner 900.

An electrical length of the first transmission line 910 is equal to ¼ of a wavelength of a signal flowing through the first transmission line 910, and an electrical length of the second transmission line 912 is equal to the electrical length of the first transmission line 910. For very high frequency (VHF for short) and ultra high frequency (UHF for short) applications, the electrical lengths of the first transmission line 910 and the second transmission line 912 are too long.

Figure 6:
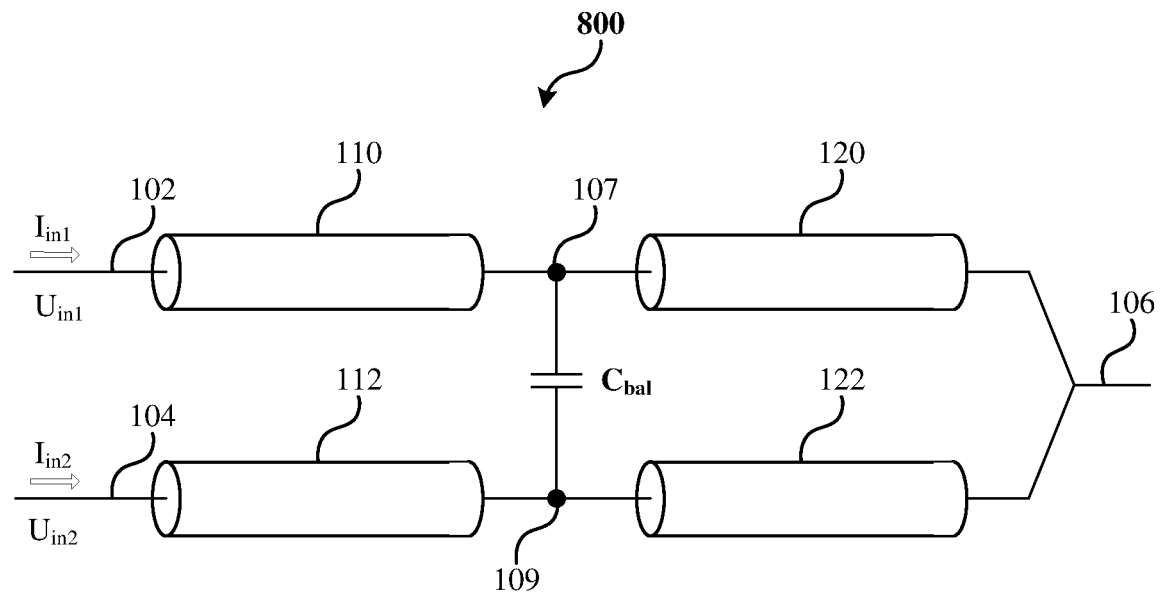
FIG. 6 is a circuit diagram of a power combiner of a first implementation of the present invention.

Refer to FIG. 6, which is a circuit diagram of a power combiner 800 of a first implementation. The power combiner 800 comprises a first port 102, a second port 104, a common port 106, a first transmission line 110, a second transmission line 120, a third transmission line 112, a fourth transmission line 122 and a balance capacitive element $C_{bal}$. In this implementation, an electrical length of the first transmission line 110 is equal to an electrical length of the third transmission line 112, and a characteristic impedance of the first transmission line 110 is equal to a characteristic impedance of the third transmission line 112; and an electrical length of the second transmission line 120 is equal to an electrical length of the fourth transmission line 122, and a characteristic impedance of the second transmission line 120 is equal to a characteristic impedance of the fourth transmission line 122.

In this embodiment, the first transmission line 110, the second transmission line 120, the third transmission line 112 and the fourth transmission line 122 are all coaxial cables. In other embodiments, the first transmission line 110, the second transmission line 120, the third transmission line 112 and the fourth transmission line 122 are all strip lines or micro strip lines.

The first transmission line 110 is coupled to the first port 102, and the second transmission line 120 is coupled between the first transmission line 110 and the common port 106. The third transmission line 112 is coupled to the second port 104, and the fourth transmission line 122 is coupled between the third transmission line 112 and the common port 106. One end of the balance capacitive element $C_{bal}$ is coupled between the first transmission line 110 and the second transmission line 120, and the other end thereof is coupled between the third transmission line 112 and the fourth transmission line 122.

In this implementation, the first port 102 is used for receiving a first electric power provided by a first power amplifier (not shown in the figure), the second port 104 is used for receiving a second electric power provided by a second power amplifier (not shown in the figure), and the common port 106 is used for providing a combined electric power based on combining the first electric power and the second electric power.

In order to solve the above-mentioned problem of the known Wilkinson power combiner 900 shown in FIG. 1, in consideration that an MOS field effect transistor inside each of the above-mentioned first power amplifier and second power amplifier is a current source, in the power combiner 800 shown in FIG. 6 in implementations of the present invention, when a current $I_{in1}$ flowing through the first port 102 and a current lint flowing through the second port 104 are unbalanced, a voltage $U_{in1}$ at the first port 102 and a voltage $U_{in2}$ at the second port 104 are made to be equal, so that the power combiner 800 shown in FIG. 6 can steadily work, because the performance of the MOS field effect transistor is decided by Vds.

It can be seen from the following equations (14) and (15), when an odd-mode input impedance $Z_{in\_odd}$ is zero, it can be ensured that the voltage $U_{in1}$ at the first port 102 and the voltage $U_{in2}$ at the second port 104 are equal.

$$U_{in1} = I_{in\_even} * Z_{in1\_even} + I_{in\_odd} * Z_{in1\_odd} = I_{in\_even} * Z_{in1\_even} \quad (14)$$

$$U_{in2} = I_{in\_even} * Z_{in2\_even} - I_{in\_odd} * Z_{in2\_odd} = = I_{in\_even} * Z_{in2\_even} \quad (15)$$

Since $Z_{in1\_even} = Z_{in2\_even} = Z_{in\_even}$, $U_{in1} = U_{in2}$.

In FIG. 6, since the balance capacitive element $C_{bal}$ is added, it can be ensured that the odd-mode input impedance $Z_{in\_odd}$ is zero. The reasoning therefor is as follows.

Figure 8:
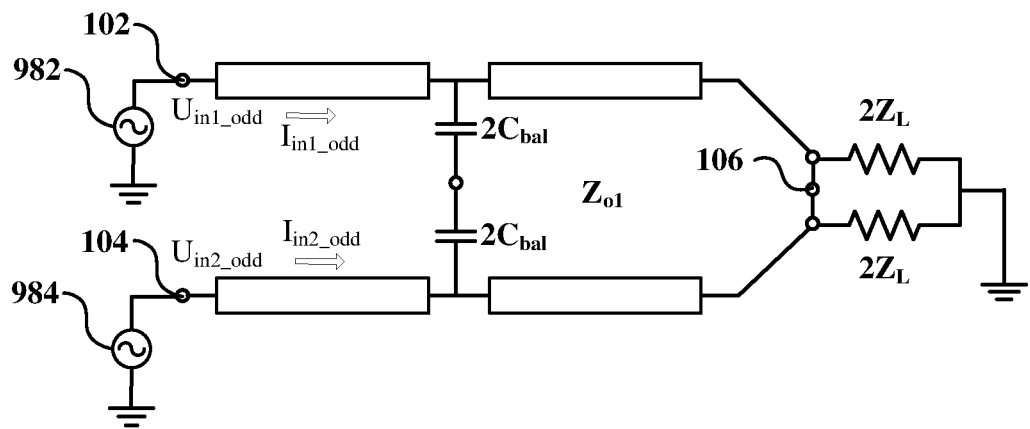
FIG. 8 is an odd-mode excitation circuit diagram of the power combiner shown in FIG. 6.

FIG. 8 is an equivalent diagram of an odd-mode excitation circuit of the power combiner 800 shown in FIG. 6, wherein the first port 102 is connected to the second port 104 via two equivalent capacitive elements connected in series, and capacitance values of the two equivalent capacitive elements are both $2C_{bal}$.

Figure 9:
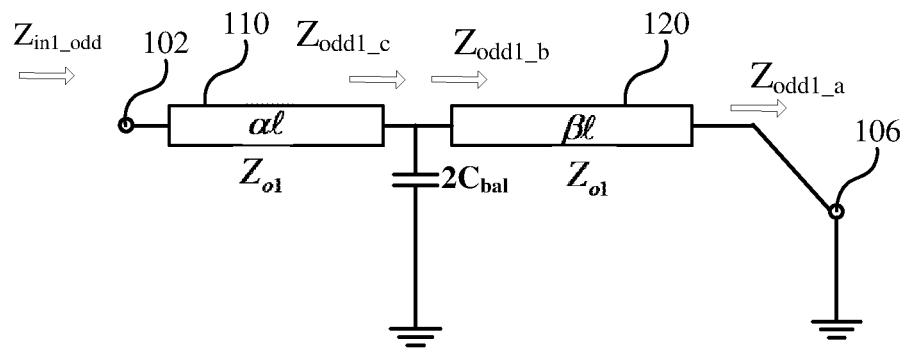
FIG. 9 is an exploded view of the odd-mode excitation circuit shown in FIG. 8.

FIG. 9 is an exploded view of the odd-mode excitation circuit shown in FIG. 8, wherein an odd-mode input impedance $Z_{odd1\_b}$ of the second transmission line 120 is calculated by the following equation (16).

$$Z_{odd1\_b} = Z_{o1} \frac{jZ_{o1} \tan\beta l}{Z_{o1}} = jZ_{o1} \tan\beta l \quad (16)$$

where $\beta l$ is an electrical length of the second transmission line 120, and $Z_{o1}$ is a characteristic impedance of the second transmission line 120.

An odd-mode output impedance of the first transmission line 110 is calculated by the following equation (17).

$$Z_{odd1\_c} = -\frac{1}{j\omega C} // jZ_{o1} \tan\beta l = \frac{Z_{o1} \tan\beta l}{1 - Z_{o1} \tan\beta l \omega C} j = Z_{o1} \tan\delta l j \quad (17)$$

where C is twice a capacitance value of the balance capacitive element $C_{bal}$, and $\omega$ is an angular frequency of a signal passing the first transmission line 110 and the second transmission line 120.

An odd-mode output impedance $Z_{odd1\_a}$ of the second transmission line 120 is calculated by the following equation (18).

$$Z_{odd1\_a} = Z_{o1} \frac{jZ_{o1}\tan\delta l + jZ_{o1}\tan\alpha l}{Z_{o1} - Z_{o1}\tan\delta l \tan\alpha l} j = Z_{o1} \frac{j\tan\delta l + j\tan\alpha l}{1 - \tan\delta l \tan\alpha l} j \quad (18)$$

where $\alpha l$ is an electrical length of the first transmission line 110, and $Z_{o1}$ is also a characteristic impedance of the first transmission line 110;

if $\delta l + \alpha l = \pi$, the odd-mode output impedance $Z_{odd1\_a}$ of the second transmission line 120 is zero, and therefore, $Z_{in1\_odd} = Z_{odd1\_a} = 0$; and in addition, because of symmetry, $Z_{in2\_odd} = Z_{in1\_odd} = Z_{in\_odd} = 0$, so that when a current flowing through the first port 102 and a current flowing through the second port 104 are unbalanced, a voltage at the first port 102 and a voltage at the second port 104 are equal, such that it can be ensured that the power combiner 800 work steadily.

The electrical length of the first transmission line 110 may be an arbitrary value, and the electrical length of the second transmission line 120 may also be an arbitrary value.

Figure 7:
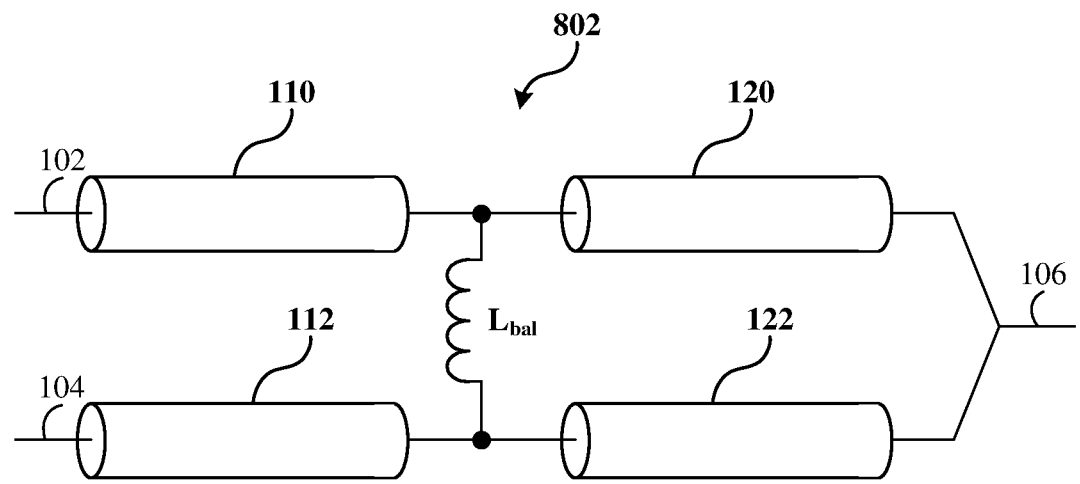
FIG. 7 is a circuit diagram of a power combiner of a second implementation of the present invention.

Referring to FIG. 7, which is a circuit diagram of a power combiner 802 of a second implementation. The difference between the power combiner 802 shown in FIG. 7 and the power combiner 800 shown in FIG. 6 is the power combiner 802 shown in FIG. 7 using a balance inductive element $L_{bal}$ to replace the balance capacitive element $C_{bal}$ in the power combiner 800 shown in FIG. 6. That is to say, one end of the balance inductive element $L_{bal}$ is coupled between the first transmission line 110 and the second transmission line 120, and the other end thereof is coupled between the third transmission line 112 and the fourth transmission line 122.

Figure 10:
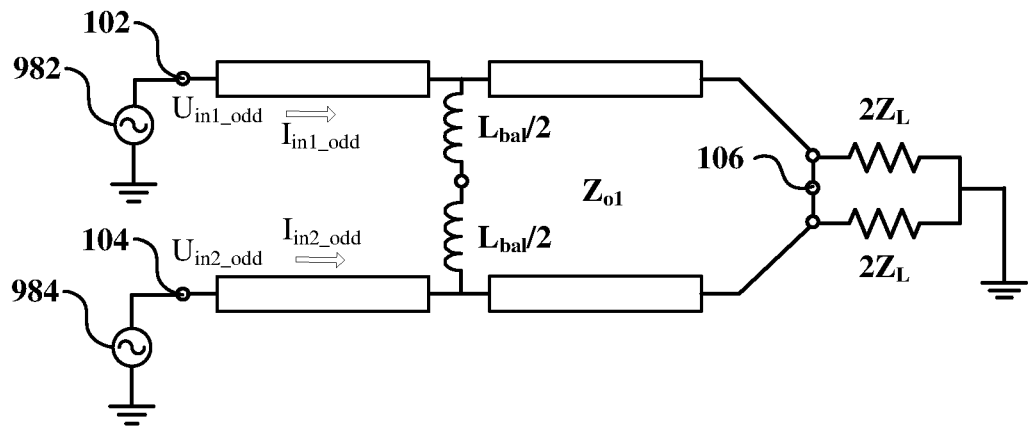
FIG. 10 is an odd-mode excitation circuit diagram of the power combiner shown in FIG. 7.

FIG. 10 is an equivalent diagram of an odd-mode excitation circuit of the power combiner 802 shown in FIG. 7, wherein the first port 102 is connected to the second port 104 via two equivalent inductive elements connected in series, and inductance values of the two equivalent inductive elements are both $L_{bal}/2$.

Figure 11:
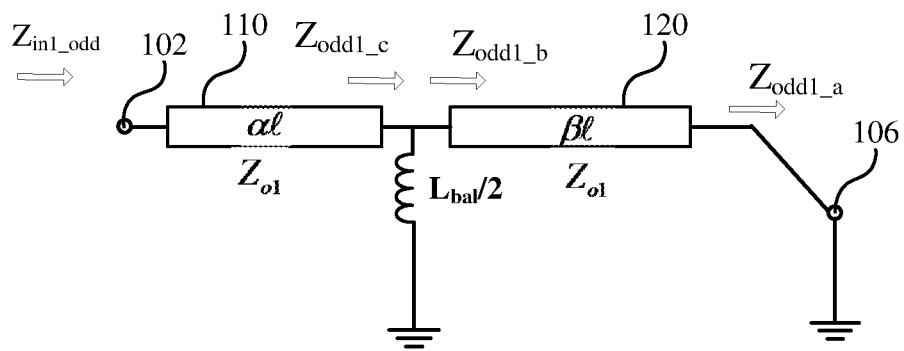
FIG. 11 is an exploded view of the odd-mode excitation circuit shown in FIG. 10.

FIG. 11 is an exploded view of the odd-mode excitation circuit shown in FIG. 10, wherein an odd-mode input impedance $Z_{odd1\_b}$ of the second transmission line 120 is calculated by the following equation (16).

Therefore, C in equation 17 mentioned above is replaced with L, to obtain the following equation (19).

$$Z_{odd1\_c} = -\frac{1}{j\omega L} // jZ_{o1}\tan\beta l = \frac{Z_{o1}\tan\beta l}{1 - Z_{o1}\tan\beta l \omega L} j = Z_{o1}\tan\delta l j \quad (19)$$

where L is half of an inductance value of the balance inductive element $L_{bal}$.

The derivation method similar to that of the power combiner 800 shown in FIG. 6 is similar to equations 16, 17 and 18 mentioned above; if $\delta l + \alpha l = \pi$ (note: $\delta l$ refers to $\delta l$ in equation 19), the odd-mode output impedance $Z_{odd1\_a}$ of the second transmission line 120 is zero, and therefore $Z_{in1\_odd} = Z_{odd1\_a} = 0$; and in addition, because of symmetry, $Z_{in2\_odd} = Z_{in1\_odd} = Z_{in\_odd} = 0$, so that when a current flowing through the first port 102 and a current flowing through the second port 104 are unbalanced, a voltage at the first port 102 and a voltage at the second port 104 are equal, such that it can be ensured that the power combiner 800 work steadily.

Figure 12:
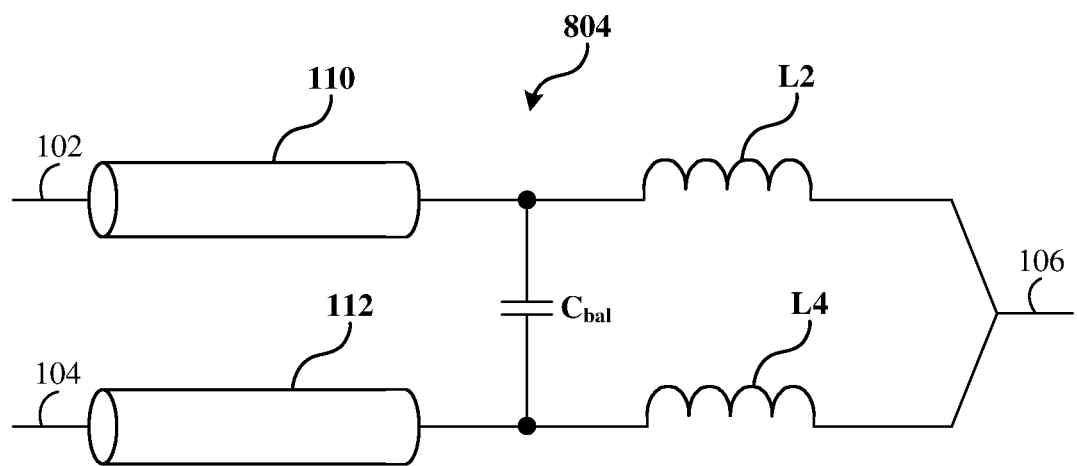
FIG. 12 is a circuit diagram of a power combiner of a third implementation of the present invention.

Referring to FIG. 12, which is a circuit diagram of a power combiner 804 of a third implementation. The difference between the power combiner 804 shown in FIG. 9 and the power combiner 800 shown in FIG. 6 is the power combiner 804 shown in FIG. 9 uses a second inductor L2 and a fourth inductor L4 to respectively substitute the second transmission line 120 and the fourth transmission line 122 in the power combiner 800 shown in FIG. 6.

In FIG. 12, in the derivation method similar to that of the power combiner 800 shown in FIG. 6, when a current flowing through the first port 102 and a current flowing through the second port 104 are unbalanced, a voltage at the first port 102 and a voltage at the second port 104 are equal, such that it can be ensured that the power combiner 804 work steadily. The difference between the derivation method for the power combiner 804 shown in FIG. 12 and the derivation method for the power combiner 800 shown in FIG. 6 is an odd-mode input impedance $Z_{odd1\_b}$ of the second inductor L2 is calculated by the following equation (20).

$$Z_{odd1\_b} = j\omega L \quad (20)$$

where L is an inductance value of the second inductor L2.

It can be understood that in other embodiments, the balance capacitive element $C_{bal}$ in the power combiner 804 shown in FIG. 9 can be replaced with a balance inductive element, which can also achieve the purpose of the implementations of the present invention.

Figure 13:
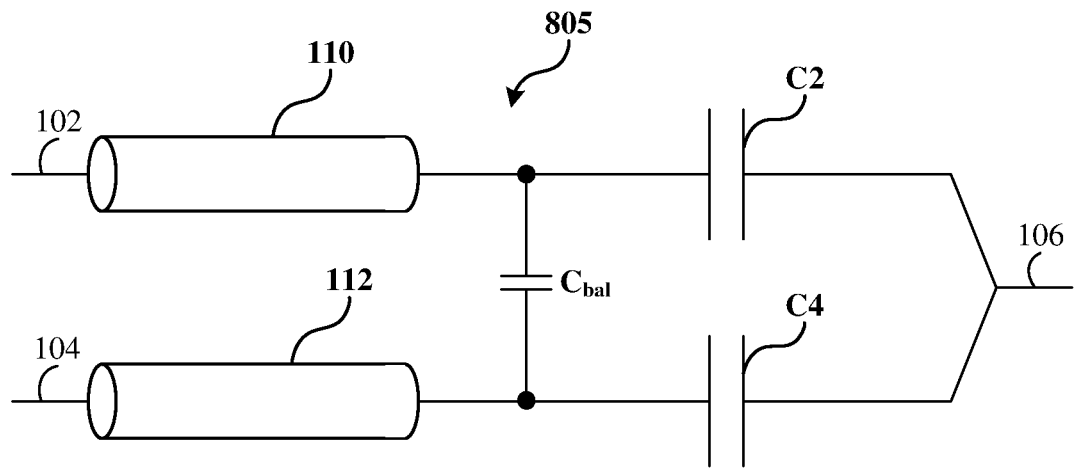
FIG. 13 is a circuit diagram of a power combiner of a fourth implementation of the present invention.

Referring to FIG. 13, which is a circuit diagram of a power combiner 805 of a fourth implementation. The difference between the power combiner 805 shown in FIG. 10 and the power combiner 800 shown in FIG. 6 is the power combiner 805 shown in FIG. 10 uses a second capacitor C2 and a fourth capacitor C4 to respectively substitute the second transmission line 120 and the fourth transmission line 122 in the power combiner 800 shown in FIG. 6.

In FIG. 13, in the derivation method similar to that of the power combiner 800 shown in FIG. 6, when a current flowing through the first port 102 and a current flowing through the second port 104 are unbalanced, a voltage at the first port 102 and a voltage at the second port 104 are equal, such that it can be ensured that the power combiner 805 work steadily. The difference between the derivation method for the power combiner 805 shown in FIG. 13 and the derivation method for the power combiner 800 shown in FIG. 6 is an odd-mode input impedance $Z_{odd1\_b}$ or C2 is calculated by the following equation (21).

$$Z_{odd1\_b} = -j/\omega C \quad (21)$$

where C is a capacitance value of the second capacitor C2.

It can be understood that in other embodiments, the balance capacitive element $C_{bal}$ in the power combiner 805 shown in FIG. 13 can be replaced with a balance inductive element, which can also achieve the purpose of the implementations of the present invention.

Figure 14:
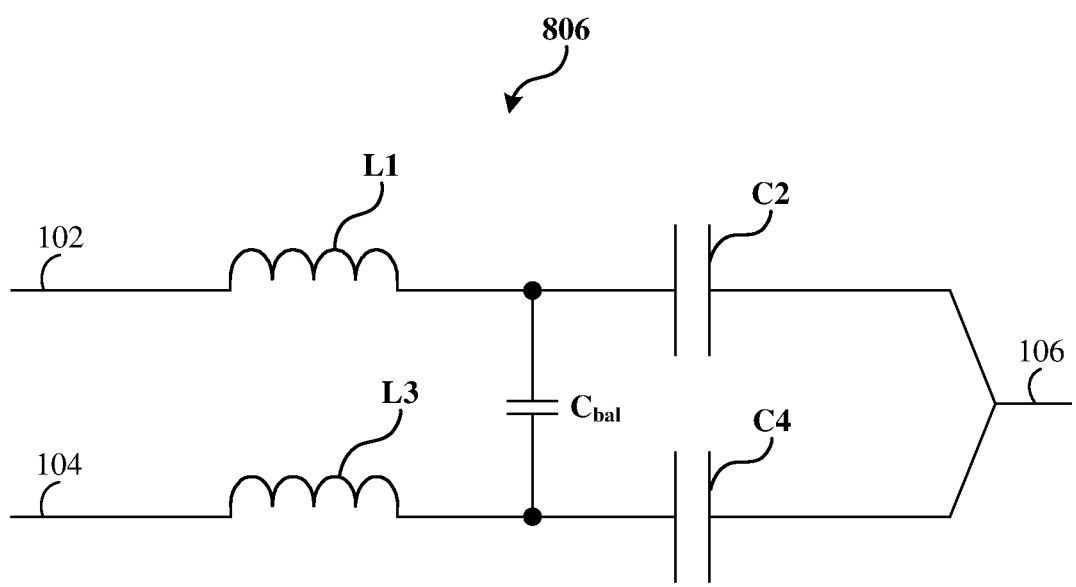
FIG. 14 is a circuit diagram of a power combiner of a fifth implementation of the present invention.

Referring to FIG. 14, which is a circuit diagram of a power combiner 806 of a fifth implementation. The power combiner 806 comprises a first inductive element L1, a second capacitive element C2, a third inductive element L3, a fourth capacitive element C4 and a balance capacitive element $C_{bal}$. The first inductive element L1 is coupled to the first port 102, and the second capacitive element C2 is coupled between the first inductive element L1 and the common port 106. The third inductive element L3 is coupled to the second port 104, and the fourth capacitive element C4 is coupled between the third inductive element L3 and the common port 106. The balance capacitive element $C_{bal}$ is coupled between a connection point between the first inductive element L1 and the second capacitive element C2 and a connection point between the third inductive element L3 and the fourth capacitive element C4.

In the derivation method similar to that of the power combiner 800 shown in FIG. 6, when a current flowing through the first port 102 and a current flowing through the second port 104 are unbalanced, a voltage at the first port 102 and a voltage at the second port 104 are equal, such that it can be ensured that the power combiner 806 work steadily.

Figure 15:
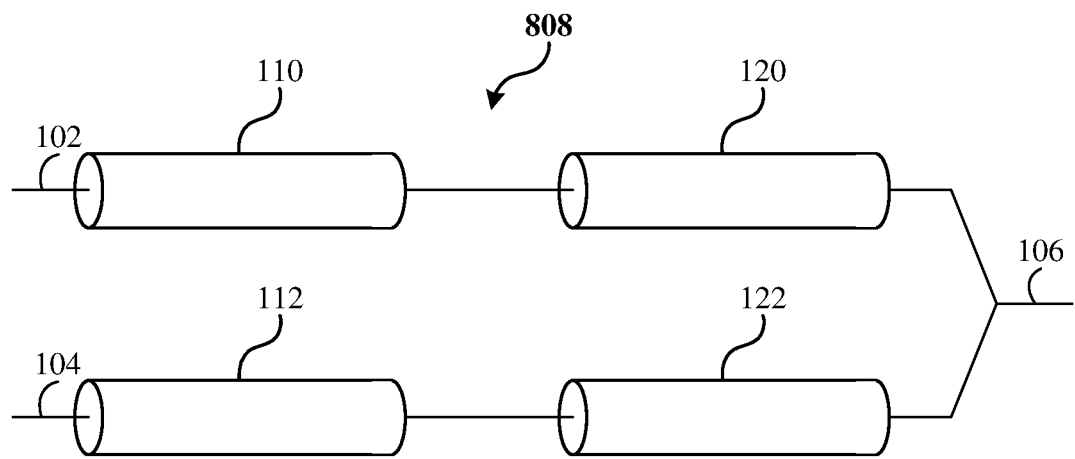
FIG. 15 is a circuit diagram of a power combiner of a sixth implementation of the present invention.

Referring to FIG. 15, which is a circuit diagram of a power combiner 808 of a sixth implementation. The power combiner 808 comprises a first transmission line 110, a second transmission line 120, a third transmission line 112 and a fourth transmission line 122. The first transmission line 110 is coupled to the first port 102, and the second transmission line 120 is coupled between the first transmission line 110 and the common port 106. The third transmission line 112 is coupled to the second port 104, and the fourth transmission line 122 is coupled between the third transmission line 112 and the common port 106. The common port 106 is coupled to a load $Z_L$.

The sum of an electrical length of the first transmission line 110 and an electrical length of the second transmission line 120 is equal to half of a wavelength of a signal transferred in each of the first transmission line 110 and the second transmission line 120, and the sum of an electrical length of the third transmission line 112 and an electrical length of the fourth transmission line 122 is equal to half of a wavelength of a signal transferred in each of the third transmission line 112 and the fourth transmission line 122.

Referring to FIG. 9 again, and the equivalent capacitive elements $2C_{bal}$ are deleted from FIG. 9, that is, becoming an odd-mode excitation decomposition circuit of the power combiner 808 shown in FIG. 12. Since the sum of an electrical length of the first transmission line 110 and an electrical length of the second transmission line 120 is equal to half of a wavelength of a signal transferred in each of the first transmission line 110 and the second transmission line 120, an odd-mode input impedance of the first port 102 $Z_{in1\_odd}=Z_{odd1\_a}=0$, and since the first port 102 is symmetric with the second port 104, an odd-mode input impedance of the second port 104 $Z_{in2\_odd}=Z_{in1\_odd}=Z_{in\_odd}=0$.

Thus, when a current flowing through the first port 102 and a current flowing through the second port 104 are unbalanced, a voltage at the first port 102 and a voltage at the second port 104 are equal, such that it can be ensured that the power combiner 808 work steadily.

Figure 16:
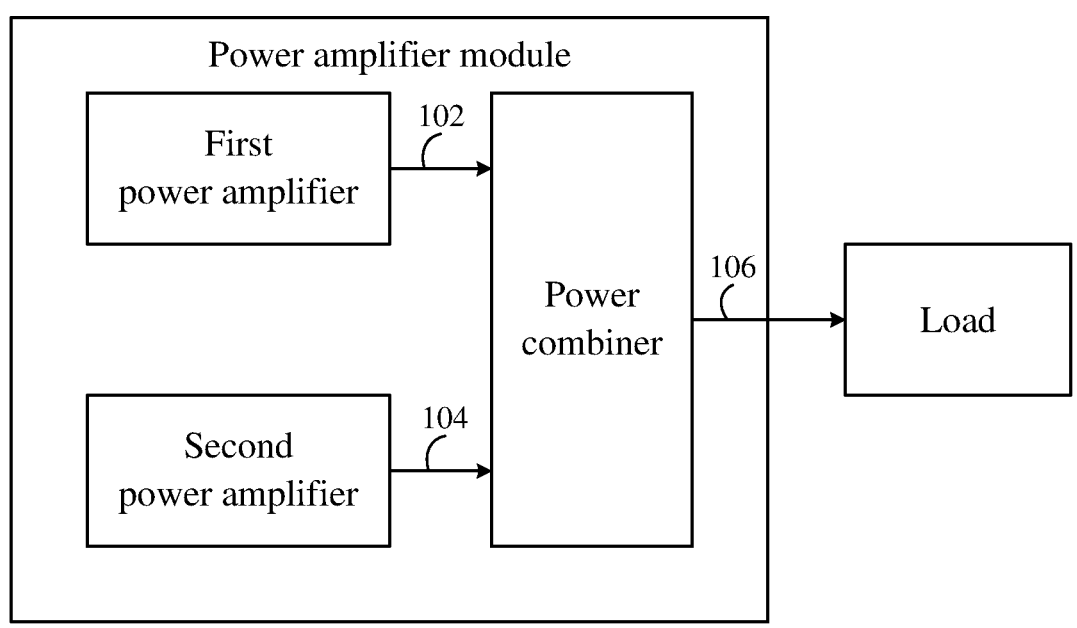
FIG. 16 is a functional module diagram of a power amplifier module of one implementation of the present invention.

As shown in FIG. 16, it is a functional module diagram of a power amplifier module 990 of one implementation. The power amplifier module 990 comprises a first power amplifier 910, a second power amplifier 920 and a power combiner 930. The power combiner 930 comprises a first port 102, a second port 104 and a common port 106. The first port 102 is used for receiving a first electric power provided by the first power amplifier 910, the second port 104 is used for receiving a second electric power provided by the second power amplifier 920, and the common port 106 is used for providing a combined electric power based on combining the first electric power and the second electric power. The combined electric power is provided to a load 940. The power combiner 930 may be any one of the power combiner 800 shown in FIG. 6, the power combiner 802 shown in FIG. 7, the power combiner 804 shown in FIG. 12, the power combiner 805 shown in FIG. 13, the power combiner 806 shown in FIG. 14 and the power combiner 808 shown in FIG. 15.

Figure 17:
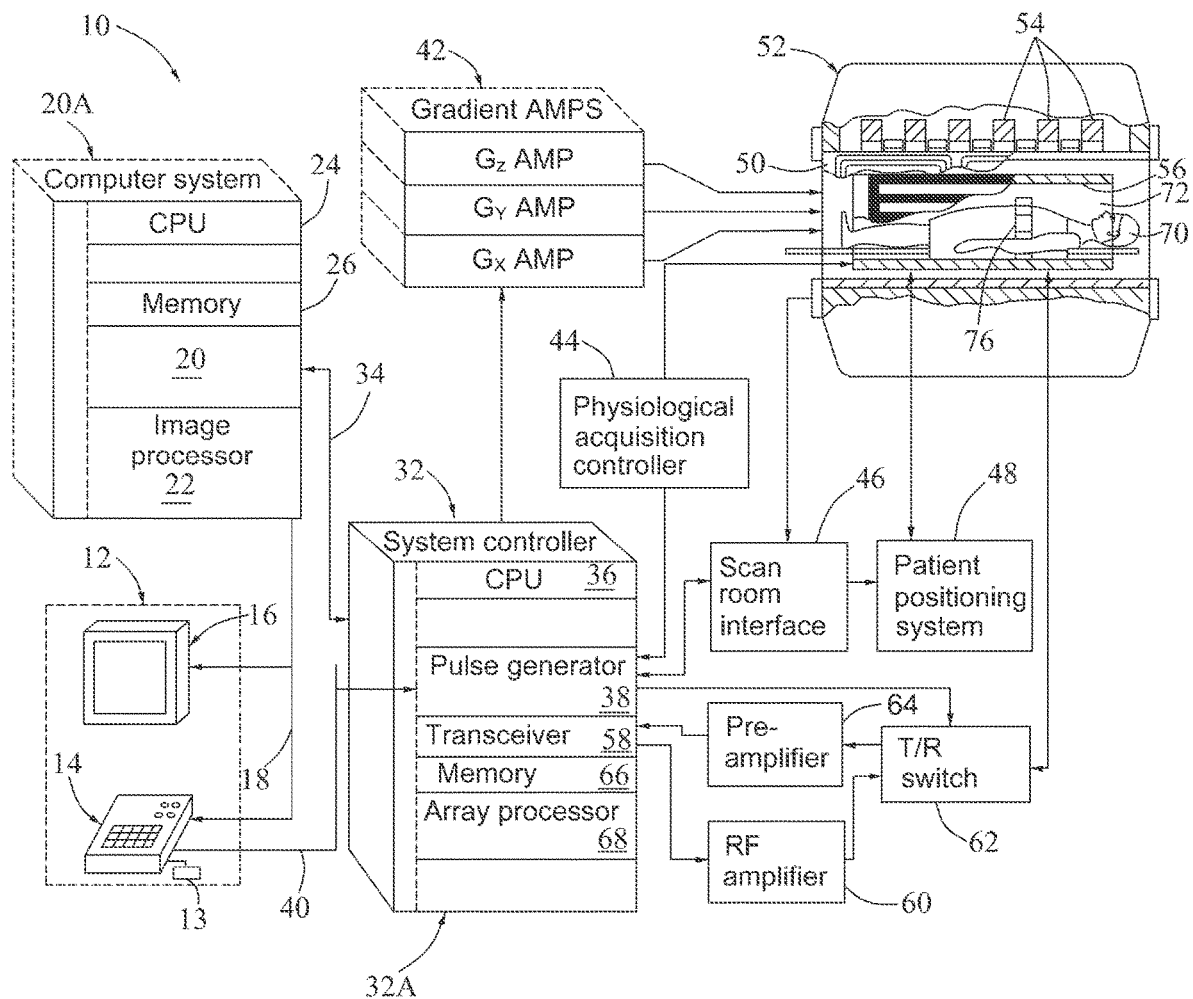
FIG. 17 is a schematic diagram of modules in a magnetic resonance imaging system of one implementation of the present invention.

Referring to FIG. 17, which is a schematic diagram of a magnetic resonance imaging (MRI) apparatus 10. The operations of the magnetic resonance imaging system 10 can be controlled from an operator console 12, and the operator console 12 comprises a keyboard or the other input device 13, a control panel 14 and a display 16. The console 12 is in communication with a computer system 20 via a link 18, and provides an interface for use by an operator to prescribe magnetic resonance scanning, display the obtained image, execute image processing on the image and archive data and the image. The input device 13 can be a mouse, a joystick, a keyboard, a trackball, a touch screen, a smooth stick, a voice control device or any similar or equivalent input device, and can be used for interactive geometry prescription.

The computer system 20 comprises a plurality of modules, and these modules communicate with each other via an electrical and/or data connection provided, for example, by using a back panel 20a. The data connection may be a direct wired link or a wireless communications link, etc. The modules of the computer system 20 comprise an image processor module 22, a central processor module 24 and a memory module 26. The memory module 26 can comprise a frame buffer for storing an image data array. In an alternative implementation, the image processor module 22 can be substituted by an image processing function run on the central processor module 24. The computer system 20 can be linked to an archive media device, a permanent or backup memory storage device or a network. The computer system 20 may also communicate with an independent system control computer 32 via a link 34.

In one implementation, the system control computer 32 comprises a set of modules communicating with each other via an electrical and/or data connection 32a. The data connection 32a may be a wired link or a wireless communications link, etc. In an alternative implementation, the modules of the computer system 20 and the system control computer 32 can be implemented on the same computer system or a plurality of computer systems. The modules of the system control computer 32 comprise a central processor module 36, and a pulse generator module 38 connected to the operator console 12 via a communication link 40.

In one implementation, the pulse generator module 38 can be integrated into a scanner device (such as a resonance assembly 52). The system control computer 32 receives, via the link 40, a command from an operator for instructing to execute a scanning sequence. The pulse generator module 38 operates a system component for giving out (namely, executing) a desired pulse sequence by sending an instruction, a command and/or a request for describing the timing sequences, strengths and shapes of radio-frequency pulses and pulse sequences to be generated and the timing and length of a data acquisition window. The pulse generator module 38 is connected to a gradient amplifier system 42 and generates data called gradient waveforms, and these gradient waveforms control the timing sequence and shape of a gradient pulse to be used during scanning.

In one implementation, the pulse generator module 38 can also receive patient data from a physiological acquisition controller 44, and the physiological acquisition controller 44 receives signals from a plurality of different sensors connected to a patient, for example, an electrocardiogram signal from an electrode attached to the patient. The pulse generator module 38 is connected to a scanning room interface circuit 46, and the scanning room interface circuit 46 receives, from various sensors, signals associated with the conditions of the patient and a magnet system. A patient positioning system 48 also receives, via the scanning room interface circuit 46, a command for moving a patient table to a desired position for scanning.

In one implementation, the gradient waveforms generated by the pulse generator module 38 are applied to the gradient amplifier system 42. The gradient amplifier system 42 comprises an X-axis gradient amplifier, a Y-axis gradient amplifier and a Z-axis gradient amplifier. Each of the gradient amplifiers excites a corresponding physical gradient coil in a gradient coil assembly (generally labelled as 50) and generates a magnetic field gradient pulse, for performing spatial encoding on the acquired signals. The gradient coil assembly 50 forms a part of the resonance assembly 52, and the resonance assembly 52 comprises a polarizing superconducting magnet with a superconducting main coil 54. The resonance assembly 52 can comprise a whole-body radio frequency coil 56, a surface or parallel imaging coil 76 or both. The coils 56 and 76 of a radio frequency coil assembly can be constructed for transmission and receiving, or transmission only or receiving only. A patient or imaging object 70 can be arranged within a cylindrical patient imaging volume 72 of the resonance assembly 52. A transceiver module 58 in the system control computer 32 generates pulses, and these pulses are amplified by a radio frequency amplifier 60 and coupled to the radio frequency coils 56 and 76 via a transmission/receiving switch 62. The obtained signals sent by an excited nucleus in the patient can be sensed by the same radio frequency coil 56, and are coupled to a pre-amplifier 64 via the transmission/receiving switch 62. Or the signals sent by the excited nucleus can be sensed by an independent receiving coil such as the parallel coil or surface coil 76. Amplified magnetic resonance signals are demodulated, filtered and digitalized in a receiver part of the transceiver 58. The transmission/receiving switch 62 is controlled by a signal from the pulse generator module 38, so that the radio frequency amplifier 60 is electrically connected to the radio frequency coil 56 during a transmission mode and the pre-amplifier 64 is connected to the radio frequency coil 56 during a receiving mode. The transmission/receiving switch 62 can also make it possible to use an independent radio frequency coil (for example, the parallel or surface coil 76) in a transmission or receiving mode.

The magnetic resonance signals sensed by the radio frequency coil 56 or the parallel or surface coil 76 are digitalized by the transceiver module 58 and transferred to a memory module 66 in the system control computer 32. Generally, data frames corresponding to the magnetic resonance signals are temporarily stored in the memory module 66, until the data frames are subsequently transformed so as to create images. An array processor 68 uses a known transformation method (the most common is Fourier transform) to create images by the magnetic resonance signals. These images are transferred to the computer system 20 via the link 34, and in the computer system 20, they are stored in a memory. In response to a command received from the operator console 12, this piece of image data can be archived in a long-term storage device, or can be further processed by means of the image processor 22, transferred to the operator console 12 and presented on the display 16.

In one implementation, the radio frequency amplifier 60 may be the power amplifier module 990 as shown in FIG. 13.

Although the implementations of the present invention are illustrated in conjunction with particular implementations, a person skilled in the art would have been able to appreciate that many modifications and variations may be made to the implementations of the present invention. Therefore, it should be recognized that the claims are intended to cover all of such modifications and variations in the true concept and scope of the implementations of the present invention.

What is claimed is:

1. A power combiner, comprising:
   a first transmission line or lumped circuit element electrically connected to a first port;
   a second transmission line or lumped circuit element electrically connected between the first transmission line or lumped circuit element and a common port, wherein a first connection point is located between i) the first transmission line or lumped circuit element and ii) the second transmission line or lumped circuit element;
   a third transmission line or lumped circuit element electrically connected to a second port;
   a fourth transmission line or lumped circuit element electrically connected between the third transmission line or lumped circuit element and the common port, wherein a second connection point is located between i) the third transmission line or lumped circuit element and ii) the forth transmission line or lumped circuit element; and
   a balance capacitive element or balance inductive element including a first end and a second end, wherein the first end is electrically connected to the first connection point, and the second end is electrically connected to the second connection point,
   wherein (i) an odd-mode input impedance of the first port is zero and (ii) an odd-mode input impedance of the second port is zero, such that a voltage at the first port is equal to a voltage at the second port when a current flowing through the first port and a current flowing through the second port are unbalanced.

2. The power combiner of claim 1, wherein each of the first lumped circuit element, the second lumped circuit element, the third lumped circuit element, and the fourth lumped circuit element comprises one of a capacitive element and an inductive element.

3. The power combiner of claim 1, wherein
   the first transmission line is electrically connected to the first port;
   the second transmission line is electrically connected between the first transmission line and the common port;
   the third transmission line is electrically connected to the second port;
   the fourth transmission line is electrically connected between the third transmission line and the common port;
   the balance capacitive element or the balance inductive element electrically connected between the first connection point between the first and second transmission lines and the second connection point between the third and fourth transmission lines.

4. The power combiner of claim 3, wherein an odd-mode input impedance of the second transmission line is calculated by the following equation 1:

$$Z_{odd1\_b} = Z_{o1} \frac{jZ_{o1}\tan\beta l}{Z_{o1}} = jZ_{o1}\tan\beta l \qquad \text{equation 1}$$

where $\beta l$ is an electrical length of the second transmission line, $Z_{o1}$ is a characteristic impedance of the second transmission line;
wherein an odd-mode output impedance of the first transmission line is calculated by the following equation 2:

$$Z_{odd1\_c} = -\frac{1}{j\omega C} // jZ_{o1}\tan\beta l = \frac{Z_{o1}\tan\beta l}{1-Z_{o1}\tan\beta l\omega C}j = Z_{o1}\tan\delta lj \quad \text{equation 2}$$

where C is twice the capacitance of the balance capacitive element, ω is an angular frequency of a signal flowing through the first transmission line and the second transmission line;

wherein an odd-mode output impedance of the second transmission line is calculated by the following equation 3:

$$Z_{odd1\_a} = Z_{o1}\frac{jZ_{o1}\tan\delta l + jZ_{o1}\tan\alpha l}{Z_{o1} - Z_{o1}\tan\delta l\tan\alpha l}j = Z_{o1}\frac{j\tan\delta l + j\tan\alpha l}{1-\tan\delta l\tan\alpha l}j \quad \text{equation 3}$$

where αl is an electrical length of the first transmission line, $Z_{o1}$ is the characteristic impedance of the first transmission line;

wherein if δl+αl=π, $Z_{in1\_odd}=Z_{odd1\_a}=0$, $Z_{in2\_odd}=Z_{in1\_odd}=0$; where $Z_{in1\_odd}$ is an odd-mode input impedance of the first port, $Z_{in2\_odd}$ is an odd-mode input impedance of the second port; such that the voltage associated with the first port is equivalent to the voltage associated with the second port when the current flowing through the first port and the current flowing through the second port are unbalanced.

5. The power combiner of claim 3, wherein an odd-mode input impedance of the second transmission line is calculated by the following equation 1:

$$Z_{odd1\_b} = Z_{o1}\frac{jZ_{o1}\tan\beta l}{Z_{o1}} = jZ_{o1}\tan\beta l \quad \text{equation 1}$$

where βl is an electrical length of the second transmission line, $Z_{o1}$ is a characteristic impedance of the second transmission line;

wherein an odd-mode output impedance of the first transmission line is calculated by the following equation 2:

$$Z_{odd1\_c} = -\frac{1}{j\omega L} // jZ_{o1}\tan\beta l = \frac{Z_{o1}\tan\beta l}{1-Z_{o1}\tan\beta l\omega C}j = Z_{o1}\tan\delta lj \quad \text{equation 2}$$

where L is a half of an inductance of the balance inductive element, ω is an angular frequency of a signal flowing through the first transmission line and the second transmission line;

wherein an odd-mode output impedance of the second transmission line is calculated by the following equation 3:

$$Z_{odd1\_a} = Z_{o1}\frac{jZ_{o1}\tan\delta l + jZ_{o1}\tan\alpha l}{Z_{o1} - Z_{o1}\tan\delta l\tan\alpha l}j = Z_{o1}\frac{j\tan\delta l + j\tan\alpha l}{1-\tan\delta l\tan\alpha l}j \quad \text{equation 3}$$

where αl is an electrical length of the first transmission line, $Z_{o1}$ is the characteristic impedance of the first transmission line;

wherein if δl+αl=π, $Z_{in1\_odd}=Z_{odd1\_a}=0$, $Z_{in2\_odd}=Z_{in1\_odd}=0$; where $Z_{in1\_odd}$ is an odd-mode input impedance of the first port, $Z_{in2\_odd}$ is an odd-mode input impedance of the second port; such that the voltage associated with the first port is equivalent to the voltage associated with the second port when the current flowing through the first port and the current flowing through the second port are unbalanced.

6. The power combiner of claim 3, wherein an electrical length of each of the first transmission line, the second transmission line, the third transmission line, and the fourth transmission line is an arbitrary value.

7. The power combiner of claim 1, wherein the second lumped circuit element comprises a second inductive element, the fourth lumped circuit element comprises a fourth inductive element;
   the first transmission line electrically connected to the first port;
   the second inductive element electrically connected between the first transmission line and the common port;
   the third transmission line electrically connected to the second port;
   the fourth inductive element electrically connected between the third transmission line and the common port;
   the balance capacitive element electrically connected between the first connection point between the first transmission line and the second inductive element and the second connection point between the third transmission line and the fourth inductive element.

8. The power combiner of claim 1, wherein the first lumped circuit element comprises a first inductive element, the second lumped circuit element comprises a second capacitive element, the third lumped circuit element comprises a third inductive element, the fourth lumped circuit element comprises a fourth capacitive element;
   the first inductive element electrically connected to the first port;
   the second capacitive element electrically connected between the first inductive element and the common port;
   the third inductive element electrically connected to the second port;
   the fourth capacitive element electrically connected between the third inductive element and the common port;
   the balance capacitive element electrically connected between the first connection point between the first inductive element and the second capacitive element and the second connection point between the third inductive element and the fourth capacitive element.

9. The power combiner of claim 1, wherein the first port is configured to receive a first electric power;
   the second port is configured to receive a second electric power; and
   the common port is configured to provide a combined electric power based on combining the first electric power and the second electric power.

10. A power amplifier module, comprising:
   a first power amplifier for providing a first electric power;
   a second power amplifier for providing a second electric power; and
   a power combiner comprising:
      a first transmission line or lumped circuit element electrically connected to a first port which is configured to receive the first electric power;
      a second transmission line or lumped circuit element electrically connected between the first transmission line or lumped circuit element and a common port, wherein a first connection point is located between i)

the first transmission line or lumped circuit element and ii) the second transmission line or lumped circuit element;

a third transmission line or lumped circuit element electrically connected to a second port which is configured to receive the second electric power;

a fourth transmission line or lumped circuit element electrically connected between the third transmission line or lumped circuit element and the common port, wherein a second connection point is located between i) the third transmission line or lumped circuit element and ii) the forth transmission line or lumped circuit element; and a balance capacitive element or balance inductive element coupled between a including a first end and a second end, wherein the first end is electrically connected to the first connection point, and the second end is electrically connected to the second connection point, wherein (i) an odd-mode input impedance of the first port is zero and (ii) an odd-mode input impedance of the second port is zero, such that a voltage at the first port is equal to a voltage at the second port when a current flowing through the first port and a current flowing through the second port are unbalanced.

11. A magnetic resonance imaging (MRI) system, comprising:

a main magnet for generating a main magnetic field;

a gradient coil assembly;

a gradient amplifier for exciting the gradient coil assembly to produce a gradient magnetic field affecting the main magnetic field along selected gradient axes;

a radio frequency (RF) coil assembly; and an RF amplifier comprising:

a first power amplifier for providing a first electric power;

a second power amplifier for providing a second electric power; and a power combiner comprising:

a first transmission line or lumped circuit element electrically connected to a first port which is configured to receive the first electric power;

a second transmission line or lumped circuit element electrically connected between the first transmission line or lumped circuit element and a common port, wherein a first connection point is located between i) the first transmission line or lumped circuit element and ii) the second transmission line or lumped circuit element;

a third transmission line or lumped circuit element electrically connected to a second port which is configured to receive the second electric power;

a fourth transmission line or lumped circuit element electrically connected between the third transmission line or lumped circuit element and the common port, wherein a second connection point is located between i) the third transmission line or lumped circuit element and ii) the forth transmission line or lumped circuit element; and a balance capacitive element or balance inductive element including a first end and a second end, wherein the first end is electrically connected to the first connection point, and the second end is electrically connected to the second connection point, wherein (i) an odd-mode input impedance of the first port is zero and (ii) an odd-mode input impedance of the second port is zero, such that a voltage at the first port is equal to a voltage at the second port when a current flowing through the first port and a current flowing through the second port are unbalanced, and wherein the common port is configured to provide a combined electric power based on combining the first electric power and the second electric power, the combined electric power is configured to excite the RF coil assembly to transmit RF signals.

12. The MRI system of claim 11, wherein the voltage associated with the first port is equal to the voltage associated with the second port when the current flowing through the first port and the current flowing through the second port are unbalanced.

13. A power combiner, comprising:

a first transmission line electrically connected to a first port;

a second transmission line electrically connected between the first transmission line and a common port, wherein a first connection point is located between i) the first transmission line or lumped circuit element and ii) the second transmission line or lumped circuit element;

a third transmission line electrically connected to a second port;

a fourth transmission line electrically connected between a third transmission line and the common port, wherein a second connection point is located between i) the third transmission line or lumped circuit element and ii) the forth transmission line or lumped circuit element; and a balance capacitive element or balance inductive element including a first end and a second end, wherein the first end is electrically connected to the first connection point, and the second end is electrically connected to the second connection point, wherein (i) an odd-mode input impedance of the first port is zero and (ii) an odd-mode input impedance of the second port is zero, such that a voltage at the first port is equal to a voltage at the second port when a current flowing through the first port and a current flowing through the second port are unbalanced, and wherein a sum of an electrical length of the first transmission line and the second transmission line is equal to a half of a wavelength of signals transmitted along the first transmission line and the second transmission line, and a sum of an electrical length of the third transmission line and the fourth transmission line is equal to a half of a wavelength of signals transmitted along the third transmission line and the fourth transmission line.

* * * * *